US 10,998,714 B2

United States Patent
Ishida et al.

(12) United States Patent
(10) Patent No.: US 10,998,714 B2
(45) Date of Patent: May 4, 2021

(54) SHORT CIRCUIT PROTECTION DEVICE FOR BATTERY MONITORING SYSTEM

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hidetoshi Ishida, Mie (JP); Shinichi Takase, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 282 days.

(21) Appl. No.: 16/314,278

(22) PCT Filed: Jun. 8, 2017

(86) PCT No.: PCT/JP2017/021227
§ 371 (c)(1),
(2) Date: Dec. 28, 2018

(87) PCT Pub. No.: WO2018/003444
PCT Pub. Date: Jan. 4, 2018

(65) Prior Publication Data
US 2019/0207381 A1 Jul. 4, 2019

(30) Foreign Application Priority Data
Jun. 29, 2016 (JP) .............................. JP2016-129095

(51) Int. Cl.
*H01M 10/46* (2006.01)
*H02H 7/18* (2006.01)
(Continued)

(52) U.S. Cl.
CPC ............... *H02H 7/18* (2013.01); *B60R 16/02* (2013.01); *G01R 31/3835* (2019.01);
(Continued)

(58) Field of Classification Search
CPC .... H02J 7/0026; H02J 7/0029; H02J 7/00302; H02J 7/00304; H02J 7/00306;
(Continued)

(56) References Cited

U.S. PATENT DOCUMENTS

2009/0104510 A1* 4/2009 Fulop ...................... H01M 2/30
429/50
2018/0254514 A1* 9/2018 Li ..................... H01M 10/0459
2019/0312256 A1* 10/2019 Saeki .................. H01M 10/052

FOREIGN PATENT DOCUMENTS

JP       2002-251985       9/2002
JP       2002-279970       9/2002
(Continued)

OTHER PUBLICATIONS

Official Communication issued in International Bureau of WIPO Patent Application No. PCT/JP2017/021227, dated Aug. 22, 2017.

*Primary Examiner* — Edward Tso
(74) *Attorney, Agent, or Firm* — Greenblum & Bernstein, P.L.C.

(57) ABSTRACT

The present invention reliably prevents a problem caused by a short circuit. A short circuit protection device for a battery monitoring system according to the present invention includes: a battery that is an assembled battery including a plurality of battery cells; a battery monitoring apparatus for detecting the voltage of the battery; and a plurality of electric (Continued)

wires that connect the battery and the battery monitoring apparatus, and in each of which an eluting portion is formed midway in a lengthwise direction, the eluting portion being a portion where an insulating coating has been stripped and a core wire is exposed. When the eluting portions are immersed in an electrolyte, the eluting portions elute into the electrolyte, thereby melt and are cut off.

7 Claims, 8 Drawing Sheets

(51) Int. Cl.
| | |
|---|---|
| H02J 7/00 | (2006.01) |
| H01M 10/48 | (2006.01) |
| B60R 16/02 | (2006.01) |
| H01M 2/10 | (2006.01) |
| H01M 2/34 | (2006.01) |
| G01R 31/3835 | (2019.01) |
| H01M 2/20 | (2006.01) |
| H01M 10/42 | (2006.01) |

(52) U.S. Cl.
CPC ........... *H01M 2/10* (2013.01); *H01M 2/1077* (2013.01); *H01M 2/206* (2013.01); *H01M 2/34* (2013.01); *H01M 10/425* (2013.01); *H01M 10/48* (2013.01); *H01M 10/482* (2013.01); *H02J 7/00* (2013.01); *H01M 2010/4271* (2013.01); *H01M 2220/20* (2013.01)

(58) Field of Classification Search
CPC .. H02J 7/00308; H02J 7/00309; H02J 7/0013; H02J 7/1423; H01M 2/34; H01M 2/1088; H01M 2/1077; H01M 10/482; H01M 2010/4271
USPC .... 320/116, 132, 134, 136, 137; 429/50, 51; 361/10, 122
See application file for complete search history.

(56) References Cited

FOREIGN PATENT DOCUMENTS

| | | |
|---|---|---|
| JP | 2012-199007 | 10/2012 |
| JP | 2014-191886 | 10/2014 |
| JP | 2014-235849 | 12/2014 |

\* cited by examiner

SHORT CIRCUIT PROTECTION DEVICE FOR BATTERY MONITORING SYSTEM

TECHNICAL FIELD

The present invention relates to a short circuit protection device for a battery monitoring system.

BACKGROUND ART

Conventionally, it is common to mount a battery monitoring apparatus for monitoring battery charge status or the like in a hybrid vehicle or an electric vehicle. Such a technique is disclosed in Patent Document 1, which is listed below. Patent Document 1 discloses the use of an assembled battery in which a plurality of battery cells are arranged, as a battery. The battery cells are electrically connected in series so as to provide a high output voltage. The electrodes of adjacent battery cells are connected by bus bars. A voltage detection terminal is placed on each bus bar, and is connected to either one of the positive electrode or the negative electrode of the battery cell. The voltage detection terminal is connected to one end of a detection electric wire. The other end of the detection electric wire is connected to a terminal fitting, and the terminal fitting is inserted through a connector and connected to a battery monitoring apparatus (ECU). Commonly, the connector on the battery monitoring apparatus side that is connected to each detection electric wire is installed on a substrate in the ECU, and a terminal fitting drawn out of the connector is passed through a through hole formed in a printed circuit board and soldered so as to be electrically connected to a circuit formed on the printed circuit board.

CITATION LIST

Patent Document

Patent Document 1: JP 2012-199007A

SUMMARY OF INVENTION

Technical Problem

When the battery monitoring apparatus including the connector described above is immersed in an electrolyte (hereinafter, the term "electrolyte" refers to an electroconductive solution in which an ionic substance is dissolved in a polar solvent (for example, water) such as salt water, or a solution within a battery), the terminal fittings may be short circuited via the electrolyte on the printed circuit board. In this case, an overcurrent flows across the terminal fitting, and the connector may be overheated. Also, depending on the location, copper ions elute from the terminal fittings, which are commonly made of a copper alloy, which may, as a result, cause so-called terminal thinning, and further worsen the overheated state due to an increase in the resistance caused by a reduction in the cross sectional area through which electric current flows.

The present invention has been accomplished under the circumstances described above, and it is an object of the present invention to provide a short circuit protection device for a battery monitoring system that can effectively cope with the occurrence of short circuits.

Solution to Problem

A short circuit protection device for a battery monitoring system according to an aspect of the present invention includes: a battery that is an assembled battery including a plurality of battery cells; a battery monitoring apparatus for detecting a voltage of the battery; and a plurality of electric wires that connect the battery and the battery monitoring apparatus, and in each of which an eluting portion is formed midway in a lengthwise direction, the eluting portion being a portion where an insulating coating has been stripped and a core wire is exposed.

Advantageous Effects of Invention

According to an aspect of the present invention, the battery and the battery monitoring apparatus are constantly in an electrically connected state. In this case, when the eluting portions are immersed in an electrolyte such as salt water, because the core wires of the electric wires are exposed in the eluting portions, the eluting portions elute into the electrolyte, and finally melt and are cut off. Accordingly, it is possible to prevent a short circuit from occurring.

DESCRIPTION OF EMBODIMENTS

Figure 1:
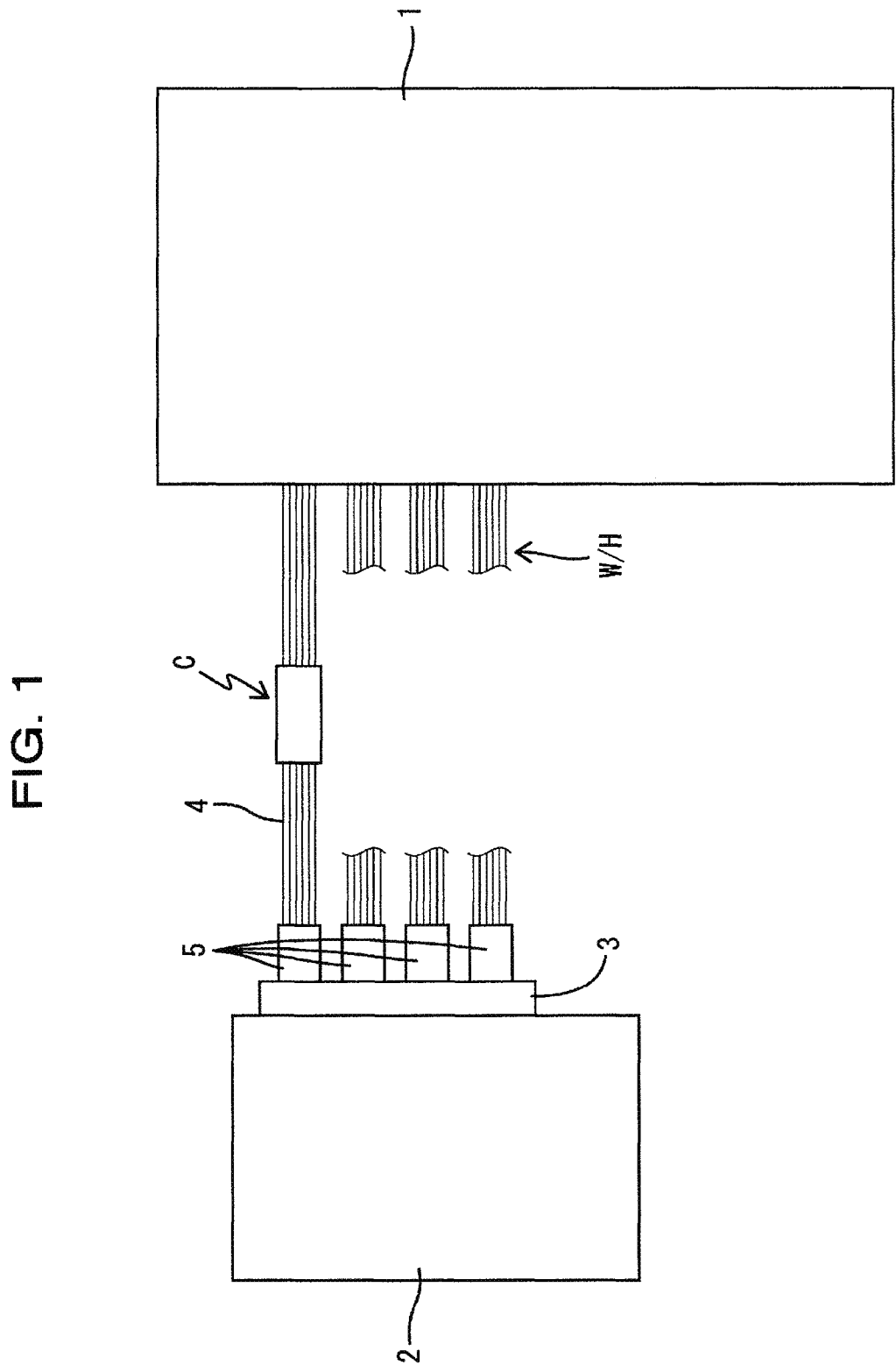
FIG. 1 is a diagram showing a state in which a battery and a battery monitoring apparatus are connected.

Preferred embodiments of the present invention will be described.

(1) It is preferable that the short circuit protection device for a battery monitoring apparatus according to an aspect of the present invention is configured such that the eluting portions of the electric wires are housed in a casing, and an introducing portion that allows an electrolyte to pass therethrough and into the casing is formed in an outer surface of the casing.

With the configuration described above, the eluting portions are collectively protected by the casing, and it is therefore possible to avoid a short circuit between adjacent eluting portions caused by an electroconductive foreign substance. Also, the electric wires are not individually protected, and thus excellent operational efficiency is also obtained. Furthermore, the casing is configured such that an electrolyte such as salt water can be introduced into the casing through the introducing portion, and it is therefore possible to reliably cause the eluting portions to elute.

(2) Also, it is preferable that electric wire holding grooves are formed in the casing, the electric wire holding grooves being configured to hold the electric wires while maintaining a spacing between the electric wires that are adjacent to each other.

With the configuration described above, the electric wires are held in the electric wire holding grooves formed in the casing, and the spacing between electric wires is maintained. Accordingly, it is possible to avoid the occurrence of a short circuit caused by adjacent eluting portions accidentally coming into contact with each other.

(3) It is preferable that the electric wires are held, with the eluting portions being spaced from an inner wall of the casing.

If the eluting portions are held in contact with the inner wall, adjacent electric wires may be short circuited due to an eluate dripping from the eluting portions. However, with the configuration described above in which the eluting portions are held so as to be raised from the inner wall of the casing, an appropriate height is ensured between the eluate and the electric wires, and it is therefore possible to avoid the occurrence of a short circuit.

(4) It is preferable that the casing is configured so as to be capable of storing the electrolyte that has entered the casing from the introducing portion.

With this configuration, even when the electrolyte level around the casing decreases, the electrolyte that has entered the casing from the introducing portion continuously remains in the casing, and it is therefore possible to reliably melt and cut off the eluting portions.

(5) It is preferable that the electric wires include electric wires in each of which the eluting portion is protected by a liquid-permeable protection member.

With the configuration described above, each eluting portion is protected by the protection member, and it is therefore possible to avoid the occurrence of a short circuit between eluting portions caused by an electroconductive foreign substance. Also, because the protection member is liquid-permeable, it does not hinder the eluting portion from being immersed in the electrolyte.

(6) It is desirable that the electric wires are made of aluminum or an aluminum alloy.

With the configuration described above, because aluminum electric wires elute more rapidly than copper electric wires that are commonly used, it is possible to melt and cut off the eluting portions in short time.

Next is a description of Examples 1 to 3 in which the short circuit protection device for a battery monitoring system according to an aspect of the present invention is implemented, with reference to the drawings.

Example 1

FIGS. 1 to 6 show Example 1 of the present invention. Among these diagrams, FIG. 1 shows an overall configuration of a battery monitoring system in which a battery 1 and a battery monitoring apparatus 2 for monitoring the charge status of the battery 1 (each battery cell) are connected by wire harnesses W/H.

The battery 1 is an assembled battery that includes a plurality of battery cells, and is mounted on a hybrid vehicle or an electric vehicle. Although details are not shown in the diagram, each battery cell includes a pair of electrodes (a positive electrode and a negative electrode) on its upper side. The battery cells are tightly aligned, and together constitute the battery 1. The battery cells are disposed such that the positive electrode and the negative electrode are alternately positioned in the alignment direction. Furthermore, the electrodes adjacent in the alignment direction are connected by bus bars, and thus all of the battery cells are connected in series.

The battery monitoring apparatus (ECU) 2 includes a box body, and a control unit (not shown) that has a function of measuring the voltage of each battery cell is incorporated in the battery monitoring apparatus 2. The control unit includes a connector 3 that is connected to a printed circuit board, and a plurality of copper terminal fittings are drawn out of the connector housing of the connector 3, and are connected to the printed circuit board.

Each wire harness W/H that connects the battery monitoring apparatus 2 and the battery 1 is composed of a plurality of electric wires 4. As shown in FIG. 1, in Example 1, the wire harnesses W/H are grouped into a plurality of groups. Copper terminal fittings (not shown) are connected to both end portions of each electric wire 4. The terminal fittings connected to portion on one end of the electric wires 4 are connected to the electrodes of the battery cells, and the terminal fittings connected to portions on the other end of the electric wires 4 are collected into groups and housed in connectors 5. The connectors 5 are connected to the connector 3 of the battery monitoring apparatus 2.

Figure 2:
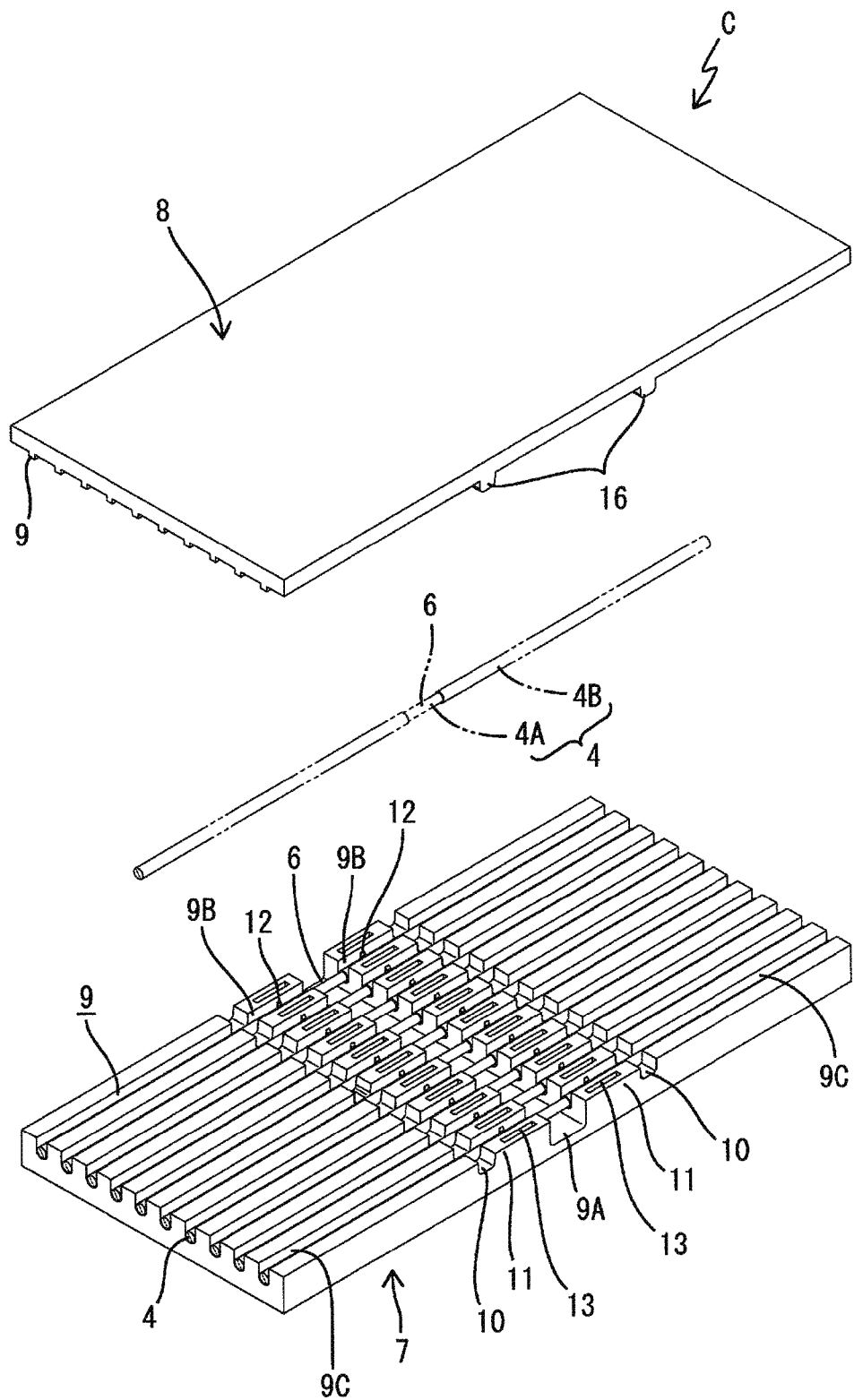
FIG. 2 is an exploded perspective view of a casing in which electric wires are housed.
Figure 5:
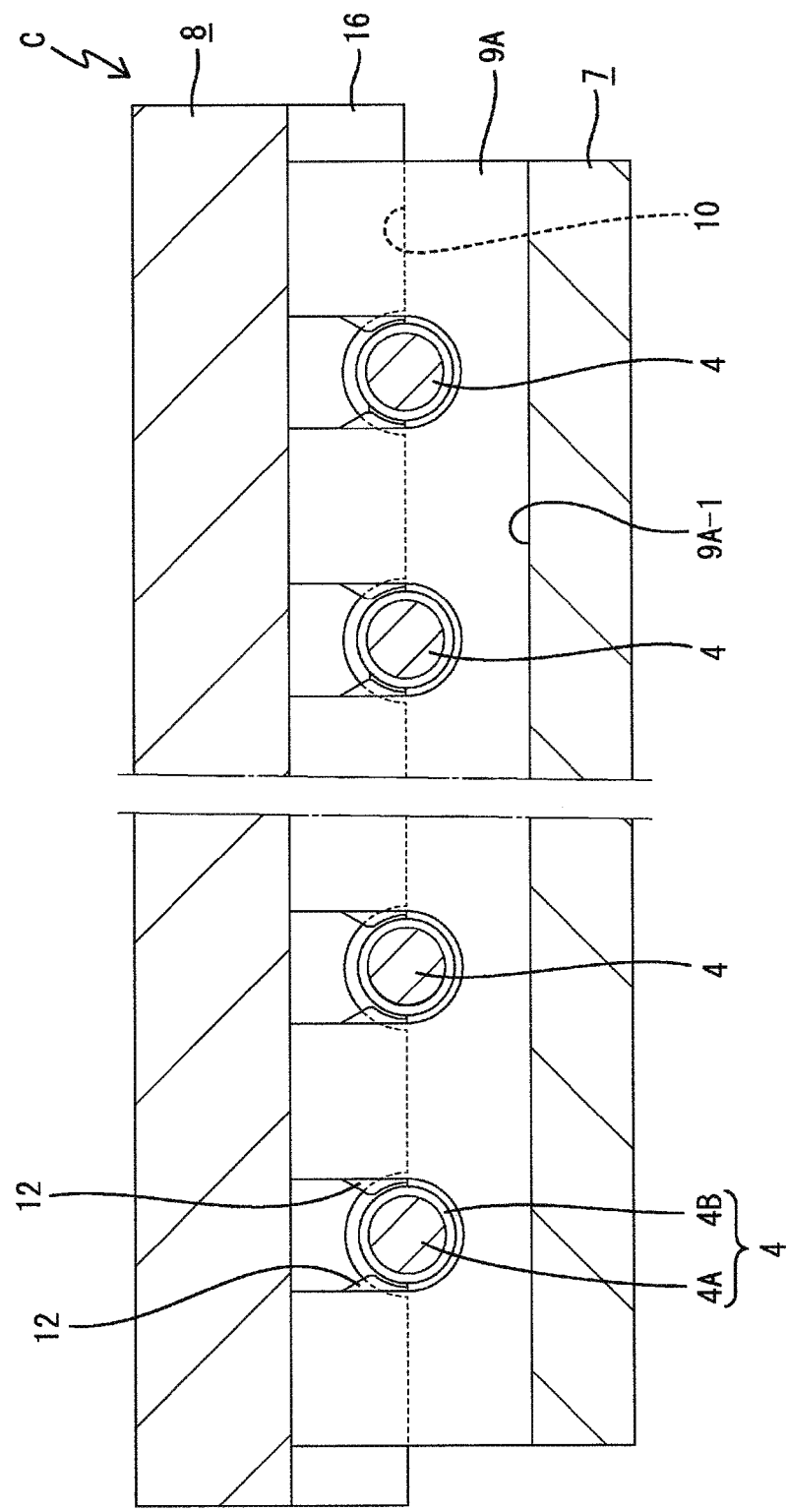
FIG. 5 is a cross sectional view taken along the line A-A shown in FIG. 4.
Figure 6:
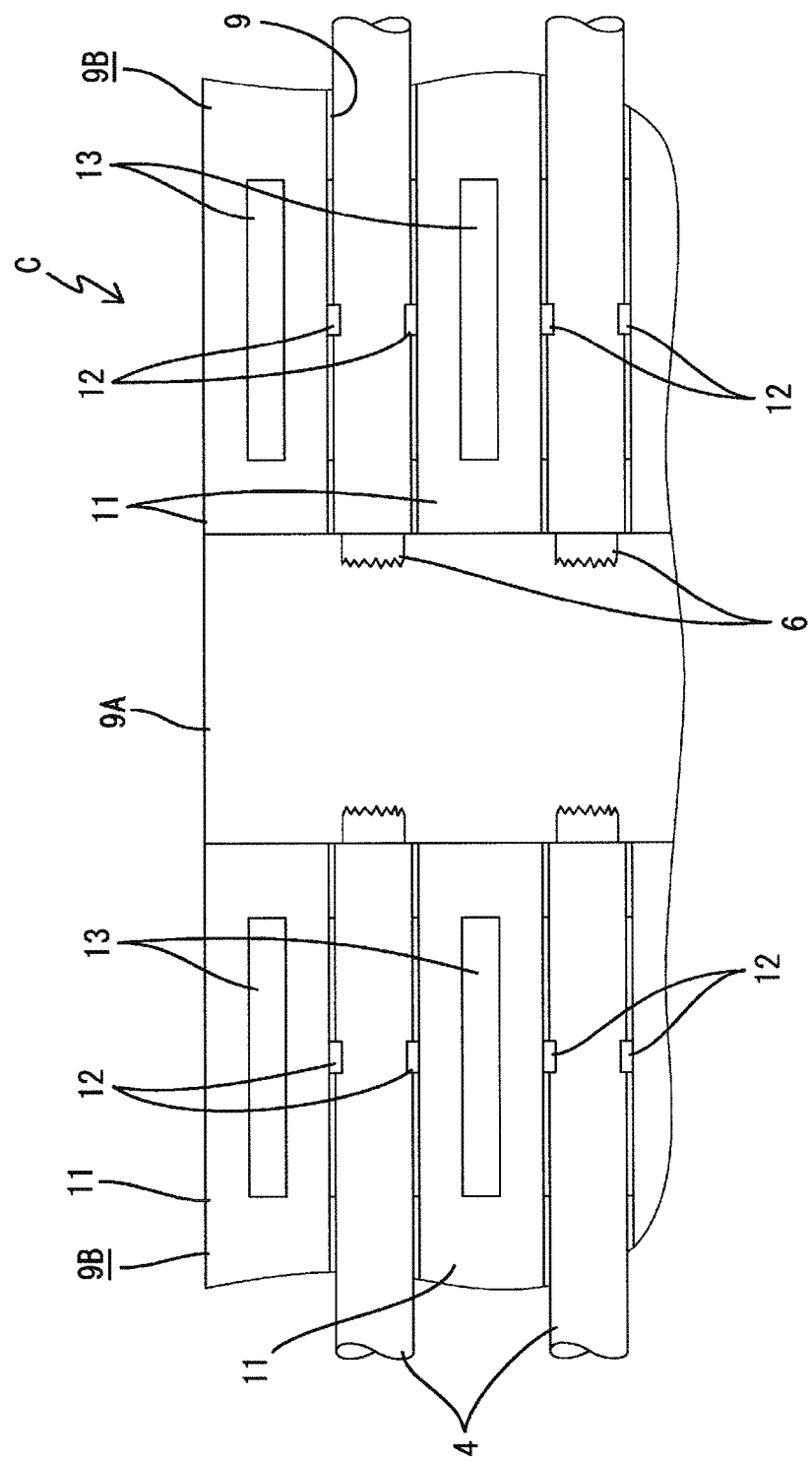
FIG. 6 is an enlarged view showing a state in which eluting portions have melted and are cut off.

As shown in FIGS. 2 and 5, each electric wire 4 includes a core wire 4A and an insulating coating 4B. In Example 1, the core wire 4A is composed of a plurality of strands made of aluminum or an aluminum alloy that are twisted together. As shown in the diagrams, in a middle portion (midway in the lengthwise direction) of each electric wire 4, a predetermined length of the insulating coating 4B has been stripped, and thereby an eluting portion 6 is formed. A predetermined length of the electric wires 4, each including the eluting portion 6, are housed in groups within a casing C.

As shown in FIG. 2, the casing C includes a case main body 7 and a lid member 8 that are unitarily formed using a synthetic resin.

The case main body 7 as a whole has a rectangular plate-like shape elongated in the extension direction of the electric wires. On the inner surface side of the case main body 7, a plurality of electric wire holding grooves 9 for housing the electric wires 4 in the lengthwise direction are formed by being recessed. The electric wire holding grooves 9 are provided so as to extend over the entire length of the case main body 7 and to be equidistantly spaced in the widthwise direction.

Each electric wire holding groove 9 is roughly composed of the following three portions. Specifically, each electric wire holding groove 9 includes a deep groove portion 9A that is provided at a center portion in the lengthwise direction, slip-off preventing portions 9B that are provided so as to sandwich the deep groove portion 9A in the front-back direction and engage with an electric wire 4 so as to prevent the electric wire 4 from upwardly slipping off, and running portions 9C that are respectively provided on the front side of one of the slip-off preventing portions 9B and the back side of the other slip-off preventing portion 9B.

In the running portions 9C, the bottom surface portion of each electric wire holding groove 9 is formed to have a substantially semi-circular cross-sectional shape so as to conform to the outer shape of a substantially lower half portion of each electric wire 4 and house the electric wire 4. Also, each electric wire holding groove 9 has a groove width that is equal to or slightly smaller than the diameter of the electric wire 4, and a depth that is sufficiently deeper than the wire diameter.

As shown in FIG. 2, a horizontal groove 10 that extends over the entire width of the casing C along the widthwise direction of the casing C is provided between each running portion 9C and the corresponding slip-off preventing portion 9B so as to extend transversely across all of the electric wire holding grooves 9. The height position of the bottom surface of each horizontal groove 10 is set to a position slightly higher than the bottom surface of the electric wire holding grooves 9 of the running portions 9C.

As shown in FIG. 2, in each slip-off preventing portions 9B, a plurality of slip-off preventing blocks 11 are provided so as to sandwich each electric wire holding groove 9 in the widthwise direction. On opposing surfaces of adjacent slip-off preventing blocks 11 in the widthwise direction, slip-off preventing projections 12 are formed in a protruding manner at a center portion in the lengthwise direction. The spacing between opposing slip-off preventing projections 12 is set to be slightly smaller than the outer diameter of each electric wire 4. Also, each slip-off preventing block 11 includes a slit 13 that extends through the case main body 7 in the thickness direction of the case main body 7. With this configuration, the surface of each slip-off preventing block 11 on which the slip-off preventing projection 12 is formed is capable of bending and deforming toward the slit 13. Accordingly, when an electric wire 4 is pressed into the space (electric wire holding groove 9) between adjacent slip-off preventing blocks 11 in the widthwise direction, the surface of each slip-off preventing block 11 on which the slip-off preventing projection 12 is formed is bent and deformed. Then, after the electric wire 4 has passed through between opposing slip-off preventing projections 12, the surface of each slip-off preventing block 11 on which the slip-off preventing projection 12 is formed elastically returns to its original shape. As a result, the electric wire 4 is engaged with the opposing slip-off preventing projections 12, and thereby prevented from upwardly slipping off (see FIG. 5).

Also, the height position at which the opposing slip-off preventing projections 12 in the widthwise direction engage with the electric wire 4 is set to be slightly lower than the top portion of the electric wire 4. Accordingly, the slip-off preventing projections 12 engage with the electric wire 4 in such a manner that the slip-off preventing projections 12 press the electric wire 4 downward while slightly embedding into the insulating coating 4B of the electric wire 4.

Figure 4:
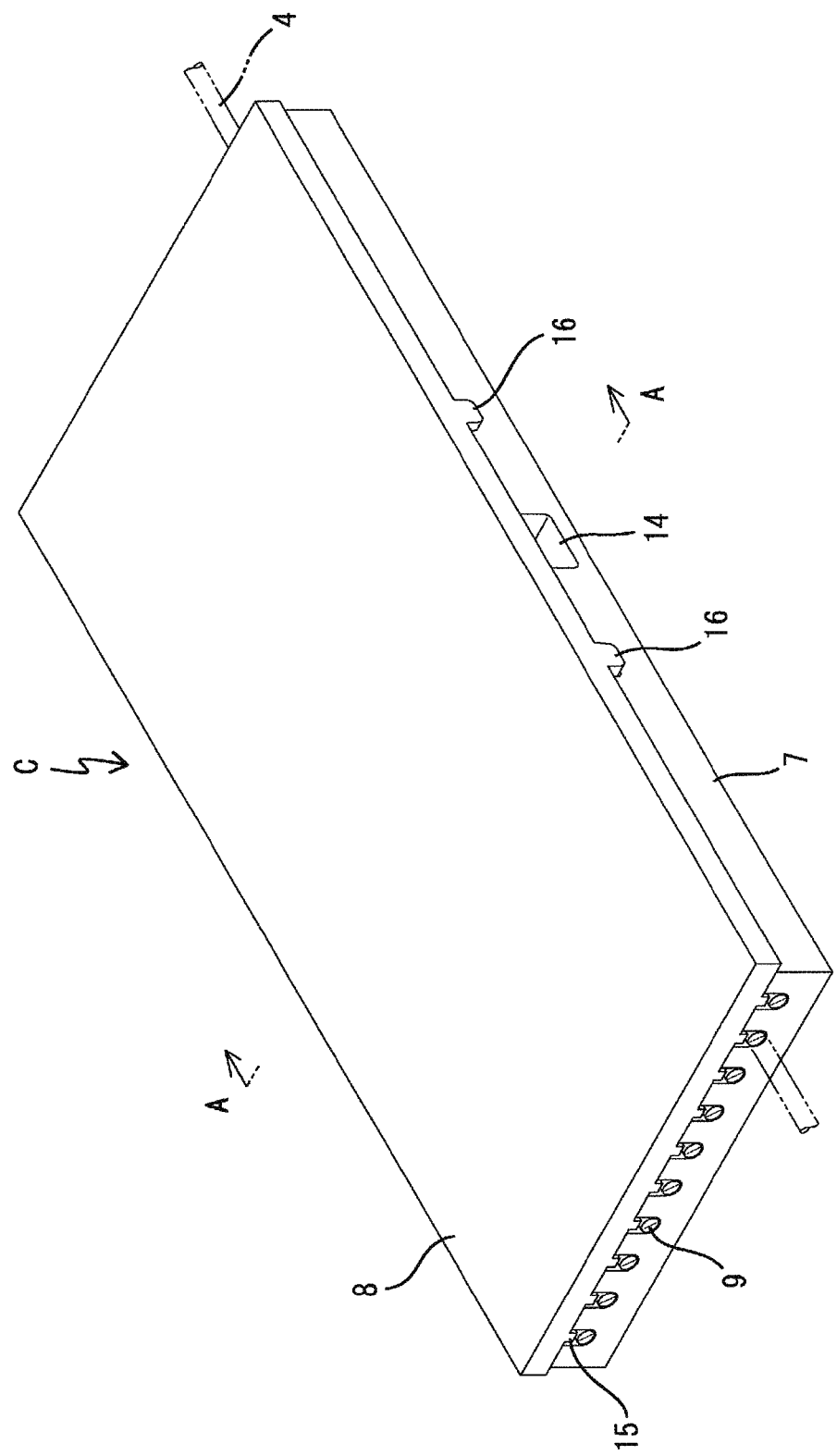
FIG. 4 is a perspective view of the casing in which electric wires are housed.

The deep groove portion 9A is a substantially center portion in the lengthwise direction in the inner surface of the casing C, and is recessed over the entire width between the slip-off preventing portions 9B that are provided in the front-back direction, so as to extend along the widthwise direction. As shown in FIG. 4, even in a state in which the lid member 8 is closed on the case main body 7, each end of the deep groove portion 9A in the widthwise direction is open to the outside, forming an introducing opening 14 (introducing portion) through which an electrolyte such as seawater is introduced. The introducing openings 14 are in communication with the eluting portions 6 of all of the electric wires 4. Accordingly, when an electrolyte is introduced through the introducing openings 14, the eluting portions 6 of all of the electric wires 4 are immersed in the electrolyte.

The deep groove portion 9A is configured to have a deeper depth than the depth of the electric wire holding grooves 9 in the running portions 9C and the slip-off preventing portions 9B. Accordingly, in a state, as shown in FIG. 5, in which the electric wires are held in the electric wire holding grooves 9, the eluting portions 6 are held at a height position spaced from a bottom surface 9A-1 of the deep groove portion 9A by a predetermined height. That is, the eluting portions 6 are held such that the eluting portions 6 are raised from the bottom surface 9A-1 of the deep groove portion 9A, and adjacent eluting portions 6 are spaced apart in the widthwise direction by an amount corresponding to the pitch of the electric wire holding grooves 9 so as to prevent the adjacent eluting portions from accidentally coming into contact with each other.

As shown in FIG. 4, the lid member 8 has substantially the same length as that of the case main body 7, but has a width slightly wider than that of the case main body 7. The lid member 8 is closed so as to cover the inner surface side of the case main body 7.

Figure 3:
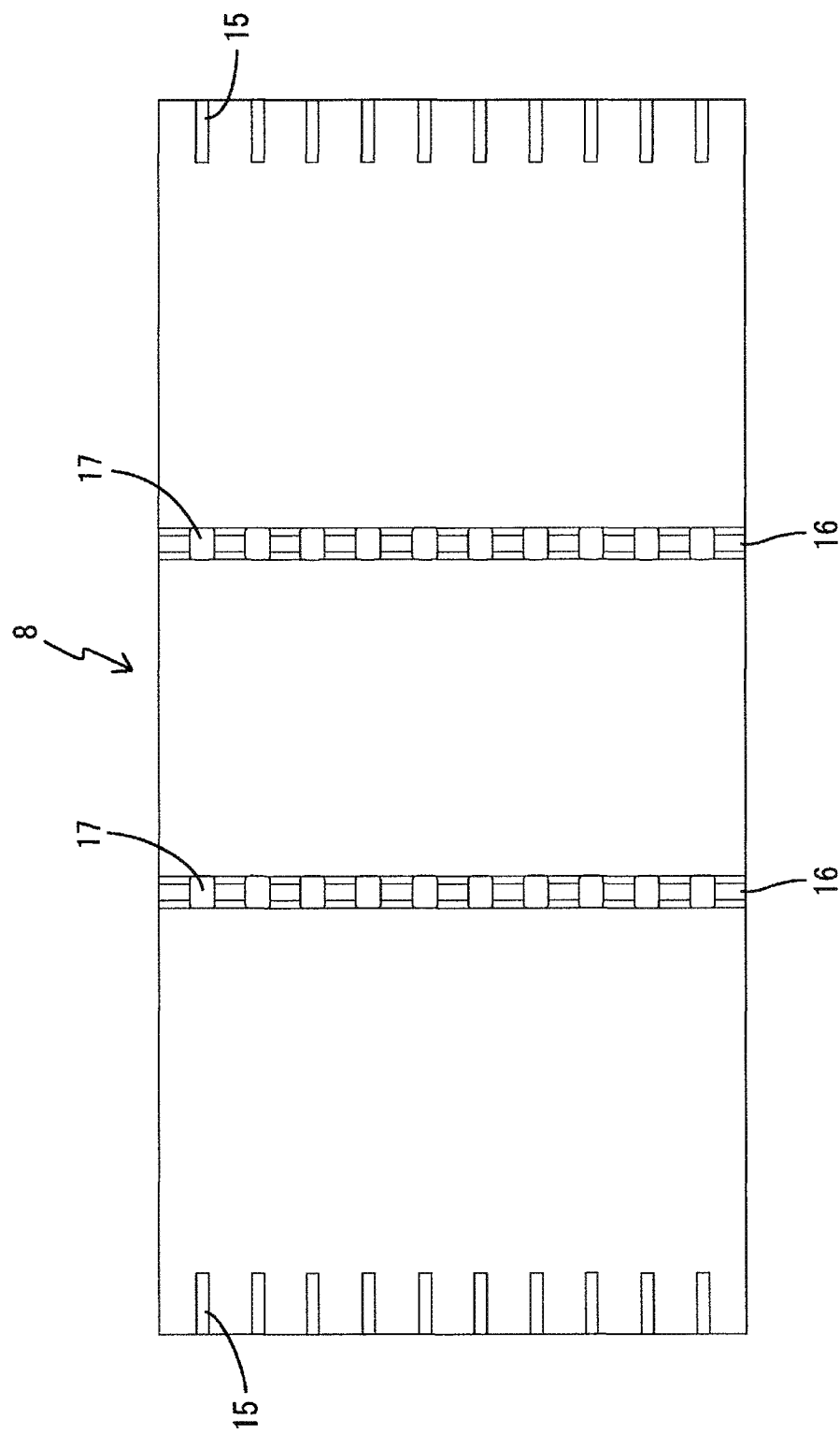
FIG. 3 is a diagram showing the underside of a lid member.

As shown in FIG. 3, on the underside of the lid member 8, a plurality of pressing projections 15 are formed in a protruding manner at both end edges in the lengthwise direction. The pressing projections 15 are provided correspondingly to the electric wire holding grooves 9 in the running portions 9C. Each pressing projection 15 is formed so as to have a predetermined length from either of both end edges of the lid member 8 in the front-back direction, and have a width smaller than the groove width of each electric wire holding groove 9. As shown in FIG. 4, when the lid member 8 is closed on the case main body 7, each pressing projection 15 presses an electric wire 4 so as to compress the top portion of the electric wire 4, and thereby holds the electric wire 4 so as to prevent the electric wire 4 from being displaced in the lengthwise direction.

Also, on the underside of the lid member 8, a pair of cross bars 16 are provided in a protruding manner in the front-back direction at positions corresponding to the horizontal grooves 10 formed in the case main body 7. Each cross bar 16 extends over the entire width along the widthwise direction of the case main body 7. The width of each cross bar 16 in the front-back direction is substantially the same as the width of each horizontal groove 10 in the front-back direction. The protruding length of each cross bar 16 is substantially the same as the depth of each horizontal groove 10, and is longer than the protruding length of each pressing projection 15. Accordingly, when the lid member 8 is closed on the case main body 7, the cross bars 16 are respectively press-fitted into the horizontal grooves 10, with both end portions of each cross bar 16 in the widthwise direction protruding outward from the case main body 7.

In each cross bar 16, relief recess portions 17 that each have a semi-circular cross-sectional shape are formed at positions corresponding to the electric wire holding grooves 9 at a spacing equal to the spacing between electric wires 4. When the lid member 8 is closed on the case main body 7, the upper half portion of each electric wire 4 comes into close contact with a relief recess portion 17, and the lower half portion of the electric wire 4 comes into close contact with an electric wire holding groove 9.

Next, actions and effects of Example 1 configured as described above will be described. In the state in which the battery 1 and the battery monitoring apparatus 2 are connected by the wire harnesses W/H, when the casing C is immersed in an electrolyte, the electrolyte enters the casing C from the introducing openings 14, and thus the eluting portions 6 of all of the electric wires 4, or in other words, the portions where aluminum electric wires are exposed are immersed in the electrolyte. At this time, all of the electric wires 4 in the casing C are constantly in an electrically connected state, and thus when a predetermined length of time passes after elution has started, the eluting portions 6 sequentially melt and are cut off from one of the eluting portions 6 that has the highest potential (see FIG. 6).

In the case where the control unit of the battery monitoring apparatus 2 is installed in a non-waterproof space, the printed circuit board and the connector 3 are also immersed in the electrolyte, and thus the copper terminal fittings that have been drawn from the connector housing and connected to the printed circuit board also elute. Accordingly, a short circuit may occur between adjacent terminal fittings due to the eluate. However, in Example 1, the eluting portions, which are aluminum core wires, melt and are cut off earlier than the copper terminal fittings. This fact has been confirmed by experiments conducted by the applicant. As described above because the eluting portions 6 melt and are cut off early, the electric connection to the battery monitoring apparatus 2 is disconnected before a short circuit occurs between terminal fittings in the battery monitoring apparatus 2, and it is therefore possible to reliably avoid a situation in which the connector 3 is overheated.

Also, Example 1 is configured such that the eluting portions 6 are covered by the casing C, and thus a short circuit caused by an electroconductive foreign substance between adjacent eluting portions 6 will not occur. Furthermore, the configuration in which the spacing between electric wires 4 is maintained by the electric wire holding grooves 9 formed in the case main body 7 also contributes to avoiding a short circuit.

Furthermore, in the case of Example 1, the electric wires 4 are positioned in the front-back direction by being pressed by the pressing projections 15. Accordingly, each electric wire 4 will not become loose in the deep groove portion 9A, and thus each eluting portion 6 can be reliably positioned within the range in which the deep groove portion 9A is formed. Also, the slip-off preventing portions 9B are formed so as to sandwich the eluting portions 6 in the front-back direction and prevent the electric wires 4 from slipping off while pressing the electric wires 4 at portions close to the eluting portions 6. Accordingly, each eluting portion 6 is reliably positioned in any of the up-down direction, the right-left direction, and the front-back direction.

As described above, as a result of the eluting portions 6 being positioned in the up-down direction, the eluting portion 6 can be raised at a predetermined height position from the bottom surface 9A-1 of the deep groove portion 9A, and it is therefore possible to avoid the occurrence of a short circuit between adjacent eluting portions 6 due to an eluate dripping from the eluting portions 6.

Also, in Example 1, aluminum electric wires are used. That is, an aluminum oxide coating film is formed in the exposed core wire portion that functions as the eluting portion 6. Accordingly, it may exhibit insulation properties depending on the thickness of the coating film formed. In this regard, using aluminum electric wires further contributes to avoiding a short circuit.

Example 2

Figure 7:
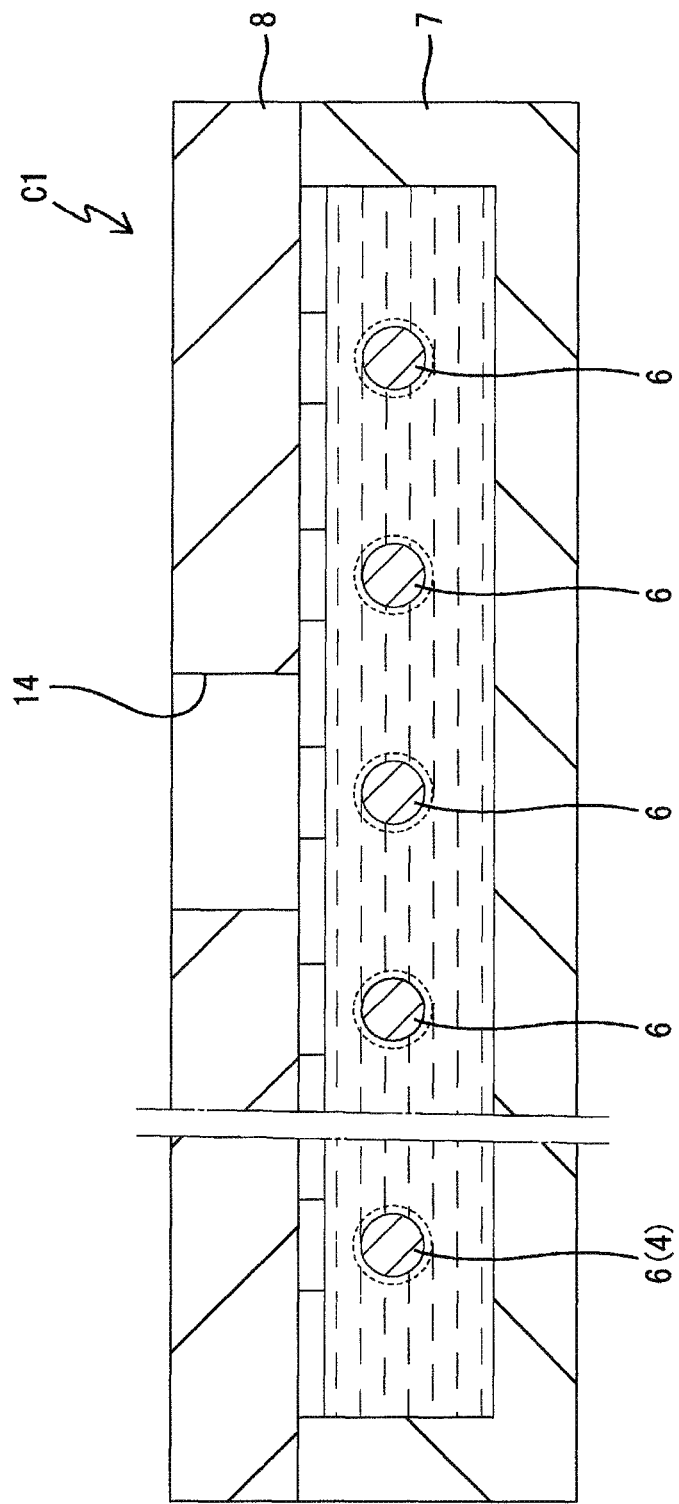
FIG. 7 is a cross sectional view of a casing according to Example 2 in which electric wires are housed.

FIG. 7 shows Example 2 of the present invention. The casing C1 of Example 1 is configured to allow the electrolyte to enter into and come out of the casing via the introducing openings 14, whereas, in Example 2, a casing C is configured such that the electrolyte is stored in the casing C.

Specifically, an introducing opening 14 is formed in the upper side of the lid member 8 of the casing C, but no opening is formed in a side surface and a bottom surface of the casing C so as to prevent the electrolyte that has entered the casing C from flowing out of the casing C.

Other than the above, the configuration is the same as that of Example 1, and thus a description thereof is omitted here.

Example 2 configured as described above exhibits the following actions and effects. Specifically, when the casing C is immersed in the electrolyte, the electrolyte enters the casing C from the introducing opening 14. After that, even when the electrolyte level decreases in a relatively short time, because the electrolyte is stored in the casing C, the eluting portions 6 are kept immersed in the electrolyte. Accordingly, even when the casing C comes out of the electrolyte, it is possible to reliably melt and cut off the eluting portions 6.

If the casing C is configured such that the electrolyte is not stored in the casing C, when the electrolyte level decreases, a situation may occur in which the connector in the battery monitoring apparatus is immersed in the electrolyte despite the fact that the casing C is out of the electrolyte. In this case, the eluting portions 6 do not melt and are not cut off, and thus a short circuit may occur between copper terminal fittings of the connector, and the connector may be overheated. The structure of Example 2 is effective in avoiding such a situation.

Example 3

Figure 8:
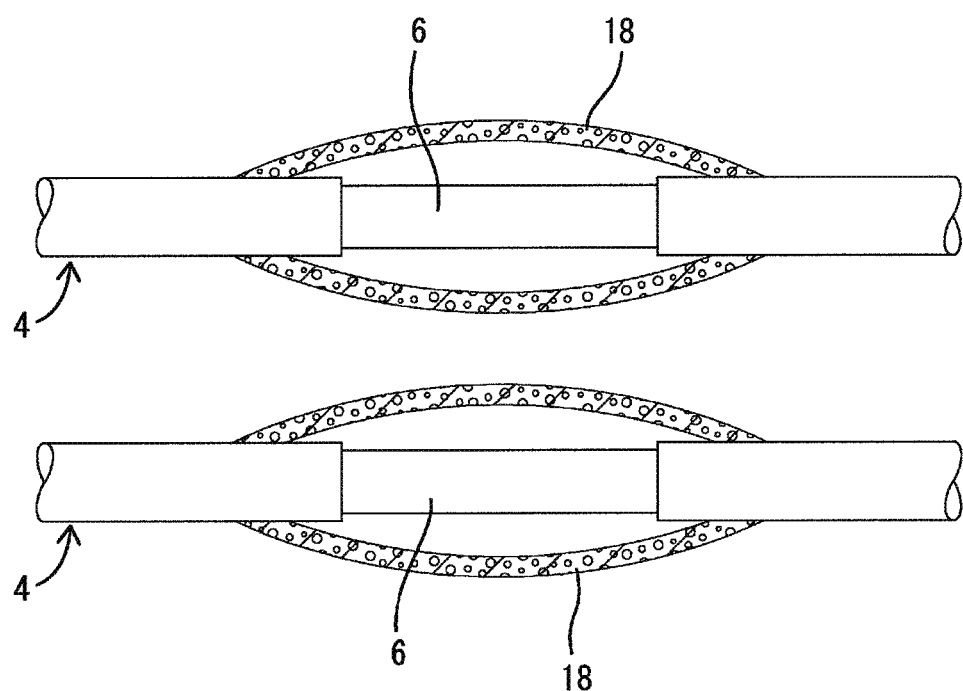
FIG. 8 is a cross sectional view showing a state in which electric wires are protected by protection members in Example 3.

FIG. 8 shows Example 3 of the present invention. Examples 1 and 2 are configured such that a plurality of electric wires 4 (eluting portions 6) are collectively housed in the casing C, but Example 3 is configured such that the eluting portions 6 of the electric wires 4 are covered with a protection member 18.

Each protection member 18 is formed so as to have a tubular shape using a liquid-permeable material (spongy material). Each protection member 18 houses an eluting portion 6, and both end portions of the protection member 18 are closed on the outer circumferential surface of the electric wire coating 4B in the front-back direction of the eluting portion 6.

With Example 3 configured as described above, each eluting portion 6 is covered with the protection member 18, and it is therefore possible to avoid a short circuit between adjacent eluting portions 6 caused by an electroconductive foreign substance. Also, because the protection member 18 is made of a spongy material and exhibits excellent liquid-permeability, it does not hinder the effect of melting and cutting off the eluting portions 6 by introducing the electrolyte.

Other Embodiments

The present invention is not limited to the examples described in the foregoing description with reference to the drawings, and for example, the following examples are also encompassed in the technical scope of the present invention.

(1) In the examples described above, the eluting portions 6 are provided in the middle area of each wire harness W/H that connects the battery 1 and the battery monitoring apparatus 2, but may be provided immediately after the connectors 5 that are connected to the battery monitoring apparatus 2. With this configuration, the spacing between electric wires 4 is maintained in an area in the lengthwise direction immediately after where the electric wires 4 are drawn from each cavity of the connector housing, and it is therefore possible to obtain an effect of eliminating the need for a dedicated member for maintaining the spacing between electric wires such as the casing C.

(2) In the examples described above, aluminum electric wires are used as the electric wires 4, but the electric wires 4 may be copper electric wires. Also, the electric wires 4 are not necessarily stranded wires, and may be single-core wires.

(3) In Examples 1 and 2 described above, the wire harnesses W/H that connect the battery 1 and the battery monitoring apparatus 2 are grouped into groups, and each group is housed in a casing C. However, all wire harnesses may be collectively housed in a single casing C, without being grouped into groups.

(4) In Examples 1 and 2 described above, the introducing opening 14 of the casing C is configured as an opening that is open to the outside, but may be closed by a cover member that allows an electrolyte or the like to pass therethrough but does not allow a foreign substance such as dust.

LIST OF REFERENCE NUMERALS

1 Battery
2 Battery monitoring apparatus
4 Electric wire
6 Eluting portion
9 Electric wire holding groove
14 Introducing opening (introducing portion)
18 Protection member
C, C1 Casing
W/H Wire harness

The invention claimed is:

1. A short circuit protection device for a battery monitoring system comprising:
    a battery that is an assembled battery including a plurality of battery cells;
    a battery monitoring apparatus for detecting a voltage of the battery; and
    a plurality of electric wires that connect the battery and the battery monitoring apparatus, each of the electric wires including an eluting portion which is formed midway in a lengthwise direction, the eluting portion being a portion where an insulating coating has been stripped and a core wire is exposed.

2. The short circuit protection device for a battery monitoring system according to claim 1, further comprising:
    a casing in which the eluting portions of the electric wires are housed, the casing including an introducing portion formed in an outer surface of the casing that allows an electrolyte to pass therethrough and into the casing.

3. The short circuit protection device for a battery monitoring system according to claim 2,
    wherein electric wire holding grooves are formed in the casing, the electric wire holding grooves being configured to hold the electric wires while maintaining a spacing between the electric wires that are adjacent to each other.

4. The short circuit protection device for a battery monitoring system according to claim 2,
    wherein the electric wires are held, with the eluting portions being spaced from an inner wall of the casing.

5. The short circuit protection device for a battery monitoring system according to claim 2,
    wherein the casing is configured to store electrolyte that has entered the casing through the introducing portion.

6. The short circuit protection device for a battery monitoring system according to claim 1,
    wherein in each of the electric wires the eluting portion is protected by a liquid-permeable protection member.

7. The short circuit protection device for a battery monitoring system according to claim 1,
    wherein the electric wires are made of aluminum or an aluminum alloy.

* * * * *